United States Patent [19]
Uritsky

[11] Patent Number: 6,051,845
[45] Date of Patent: Apr. 18, 2000

[54] METHOD AND APPARATUS FOR SELECTIVELY MARKING A SEMICONDUCTOR WAFER

[75] Inventor: Yuri Uritsky, Newark, Calif.

[73] Assignee: Applied Materials, Inc., Santa Clara, Calif.

[21] Appl. No.: 09/048,235

[22] Filed: Mar. 25, 1998

[51] Int. Cl.[7] .................................................. G01N 21/86
[52] U.S. Cl. .................................. 250/559.3; 250/559.44
[58] Field of Search ........................... 250/559.3, 559.44, 250/559.4, 556, 548; 356/399–401, 376; 235/462, 472, 463, 464; 414/936, 935

[56] References Cited

U.S. PATENT DOCUMENTS

| | | | |
|---|---|---|---|
| 4,568,879 | 2/1986 | Nakamura et al. ...................... | 324/158 |
| 4,585,931 | 4/1986 | Duncan et al. .......................... | 235/464 |
| 5,267,017 | 11/1993 | Uritsky et al. .......................... | 356/375 |
| 5,381,004 | 1/1995 | Uritsky et al. .......................... | 250/307 |
| 5,479,252 | 12/1995 | Worset et al. ........................... | 356/237 |
| 5,497,007 | 3/1996 | Uritsky et al. ........................ | 250/491.1 |
| 5,563,520 | 10/1996 | Terada ..................................... | 324/754 |
| 5,877,064 | 3/1999 | Chang et al. ............................ | 438/401 |

OTHER PUBLICATIONS

Man–Ping Cai, Yuri Uritsky, Patrick Kinney, "Optimization of Wafer Surface Particle Position Map Prior to Viewing with an Electron Microscope", American Institute of Physics, pp. 243–247, 1996. (Month Unknown).

*Primary Examiner*—Que T. Le
*Attorney, Agent, or Firm*—Thomason Moser & Patterson

[57] ABSTRACT

A method and apparatus that accurately marks a wafer at selected locations to form a wafer coordinate system. The apparatus contains a wafer platen for retaining a wafer in a substantially horizontal orientation, a wafer orientation detector assembly and a marking assembly mounted above the wafer platen. In operation, the apparatus orients the wafer by identifying an orientation attribute of the wafer, then applies fiducial marks to the wafer. The wafer marking apparatus forms a portion of an integrated analytical tool.

10 Claims, 5 Drawing Sheets

METHOD AND APPARATUS FOR SELECTIVELY MARKING A SEMICONDUCTOR WAFER

BACKGROUND OF THE DISCLOSURE

1. Field of the Invention

The invention relates to semiconductor wafer processing equipment and, more particularly, the invention relates to a method and apparatus for selectively marking a semiconductor wafer with identifiable markings.

2. Description of the Background Art

Identifying defects on the surface of a wafer, such as particulate contaminants and other surface irregularities, is extremely important to integrated circuit manufacturing processes. To eliminate defect sources, defects are identified and analyzed to determine the source of the defect. Thereafter, corrective action can be taken to reduce or eliminate the defect source.

One system used to identify defects on a patterned wafer, i.e., a wafer containing dice, is the model WF-7xx manufactured by Orbot. This system uses a laser scanning technique to identify scribe lines and other features on a patterned wafer. Then, each die is scanned and compared on a gray scale level to other dice such that defects are identified as gray level differences from die to die. Such a system is very good for identifying defects on a patterned wafer. However, since the system is optimized for die scanning, it cannot be used to identify the edge location of a wafer or the notch location of a wafer. If used for edge identification the sensors would be overloaded and damaged by the high reflectivity of the wafer edge. As such, the system uses an edge exclusion process to ensure that the sensor does not scan the wafer edge.

In another prior art system, the defect identification process is accomplished in two steps. First, a laser scanner device scans a wafer with a laser and analyses the backscatter of the laser to locate defects on the surface of the wafer. One such laser scanner device is a Tencor SurfScan 6200, manufactured by Tencor Instruments. The defects are identified and logged into a defect map. The map uses a coordinate system that is relative to the center of the wafer and a notch in the wafer, i.e., the notch and wafer center form a first axis and a second axis is perpendicular to the first axis. To make all the defect coordinates fall into the first quadrant, the coordinate system is then offset by a distance equal to the radius of the wafer, i.e., each axis is tangent to the edge of the wafer. The process of using a laser within the laser scanner device to identify the wafer edge, the wafer center and the notch location provides a coordinate system that is accurate to approximately 1 mm for a blank wafer. If the wafer contains a die or dice, the scribe lines and other features on the wafer can be used to improve the coordinate system accuracy.

Second, each defect located by the scanner is analyzed to identify the root cause of the defect. The most commonly employed analysis tool is a high magnification imaging system such as a scanning electron microscope (SEM). An SEM is used to identify the defect and/or the source of the defect by inspecting the defect at high magnification. Additionally, the SEM may be accompanied by instrumentation for performing chemical analysis of the defect. Such instrumentation includes an energy dispersive x-ray (EDX) detector. Other tools may include instrumentation for performing an Auger analysis, an atomic force microscope (AFM), a tunneling electron microscope (TEM), an optical spectrometer and the like.

Since the SEM as well as other analysis tools use a high magnification (on the order of 200 to 2000 times), rapidly positioning the SEM at the defect location can be time consuming. Although the laser device provides defect coordinates that are accurate to approximately 300 microns, a substantial amount of time can be spent manually searching, for example, a 300 by 300 micron region with the SEM for a defect having dimensions of a few tenths of micron.

Additionally, when using a SEM (or other optical analysis tool) to analyze a "bare" or "blank" wafer, i.e., a wafer having no surface features, the SEM has difficulty focusing on the wafer surface. Without an accurate focus, finding a small defect on the surface is nearly impossible.

Furthermore, some defects are identified by laser scanning, but cannot be seen with a SEM. As such, the SEM operator may search for a defect for a long period of time until realizing the defect cannot be seen with the SEM.

Some defect analysis tools, e.g., an atomic force microscope (AFM), are not readily useful when a large search area is used. Generally, the field of view for an AFM is approximately 10 $\mu m^2$, and the search area is as large as 300 $\mu m^2$. Unfortunately, an AFM requires approximately five minutes to obtain a 10 $\mu m^2$ image. As such, 900 images are required to cover a 300 $\mu m^2$ search area, requiring 4500 minutes to complete the search.

Therefore, a need exists in the art for a method and apparatus that selectively marks a wafer to produce an accurate coordinate system for use by an analysis tool such that defects or any other portions of the wafer can be rapidly identified and examined with a SEM or other analysis tool.

SUMMARY OF THE INVENTION

The invention overcomes the disadvantage of the prior art by providing a method and apparatus that accurately places fiducial marks upon a wafer surface such that these marks form an accurate wafer coordinate system, e.g., approximately 1 $\mu m$ accuracy. As such, analysis tools subsequently used to analyze a wafer or a portion of a wafer may use the fiducialization marks as a repeatable coordinate system to which defect locations (or any position) on the wafer are referred.

Specifically, the apparatus contains a wafer platen for retaining a wafer in a substantially horizontal orientation, a wafer orientation detector and a wafer marking assembly. In operation, a wafer is positioned upon the platen and retained thereupon using a vacuum chucking technique. The wafer platen is then rotated and translated until the wafer orientation detector deems the wafer correctly positioned, i.e., the wafer notch is positioned beneath the orientation detector. Once positioned, the wafer marking assembly, for example, using a laser marking device, places one or more fiducial marks onto the wafer.

Once fiducialized, the wafer can be moved to a laser scanning tool, or some other wafer analysis tool, and the fiducial marks are used to form an accurate and repeatable coordinate system to analyze the wafer. Furthermore, the wafer marking apparatus of the present invention can be incorporated into an orientation chamber of a wafer processing system to provide fiducial marks upon unprocessed wafers. The fiducial marks can be used during subsequent wafer processing steps to orient the wafer and various masks to achieve accurate alignment.

In another embodiment of the invention, the wafer marking apparatus is incorporated as a wafer marking portion of an integrated analytic tool. The analytic tool contains a load lock for providing a source of wafers to the tool, a wafer marking portion, a wafer analysis portion and a centrally located wafer transport mechanism. The wafer transport mechanism is a conventional wafer handling robot that places and retrieves wafers to/from the load lock, the wafer marking portion and the wafer analysis portion. The analytic tool has a controller that automates the process fiducializing wafers and analyzing them. To this end, the controller controls the robot as well as the marking portion and analysis portion. The analytic tool can be expanded to contain multiple analysis portions, e.g., a laser scanning tool, a scanning electron microscope, a tunneling electron microscope, a atomic force microscope, and so on, that are each accessed by the robot. As such, using the integrated analytical tool of the present invention, a multitude of sequential analytical processes can be performed on a wafer without operator intervention.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
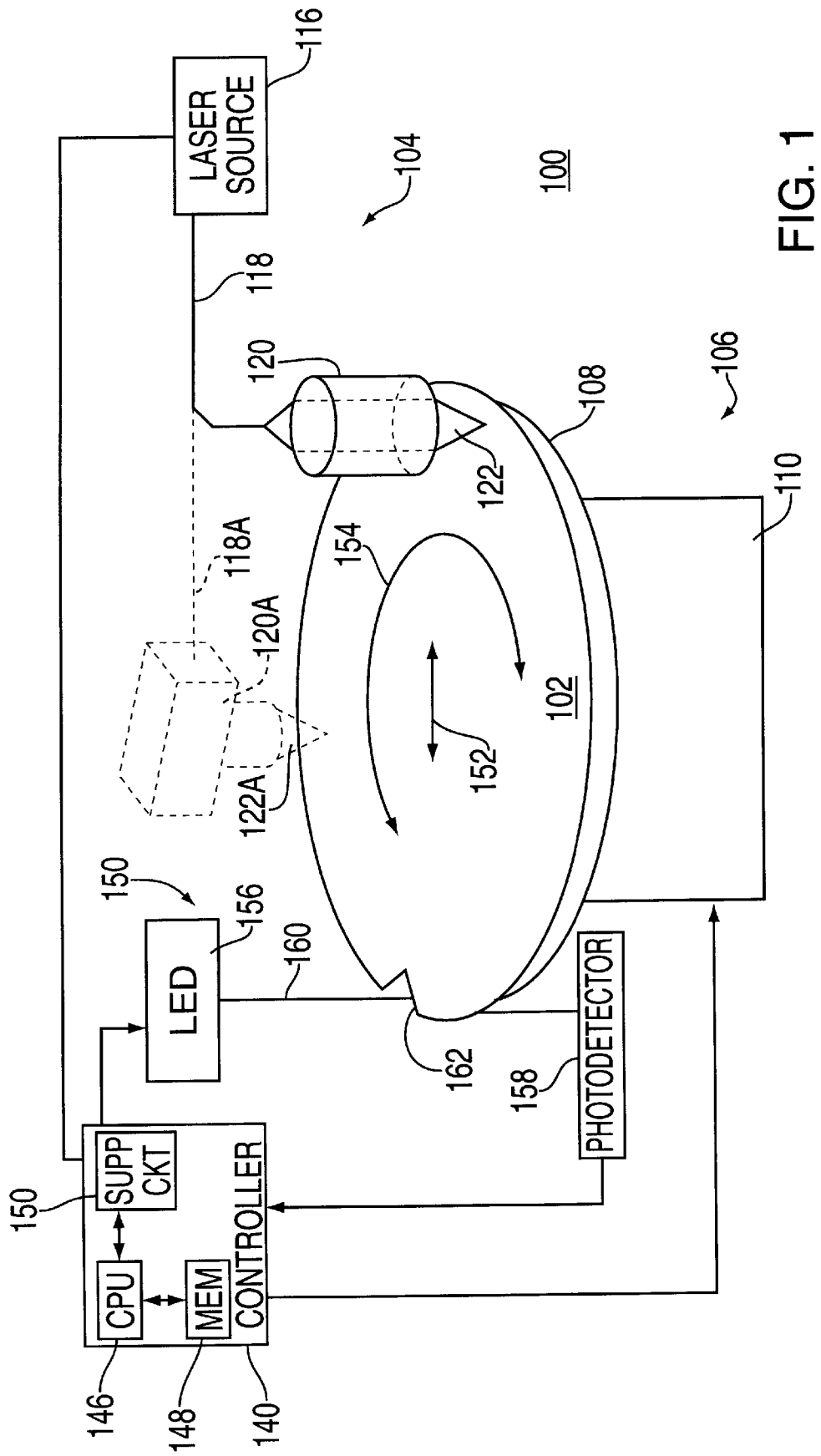
FIG. 1 depicts a simplified schematic view of the wafer marking apparatus of the present invention.

FIG. 1 depicts a simplified, schematic diagram of a wafer marking system 100 for selectively marking a wafer 102 with fiducial markings. The wafer marking system 100 contains a marking assembly 104, a wafer orientation detector assembly 150, a wafer platen assembly 106 and a controller 140. The wafer platen assembly 106 retains a wafer 102 and, in response to signals from the controller 140, rotates and translates the wafer 102 relative to the marking assembly 104 and the wafer orientation detector 150.

The controller is a general purpose computer (e.g., comprising a central processing unit (CPU) 146, memory 148 and various support circuits 150 such as power supplies, cache, input/output (I/O) circuits and the like) that is programmed to cause the system 100 to perform the routines and methods of the present invention. Alternatively, the controller can be a dedicated microprocessor or application specific integrated circuit (ASIC) that is specially designed or programmed to control the system.

The platen assembly 106 contains a wafer platen 108 and a platen drive 110. The platen 108 is a circular plate that holds the wafer 102 in a substantially horizontal orientation using a conventional vacuum chucking technique. Other well-known wafer retention techniques include electrostatic chucks, clamp rings, and the like. The platen drive 110 is coupled to the platen 108 by a shaft (not shown). The drive 110 rotates which in turn causes the shaft to rotate (along arrow 154) the platen 108 through an angle of up to 360 degrees. The drive 110 is, for example stepper motor. The platen drive 106, in addition to rotating the platen 108, also linearly translates the platen 108 in the direction indicated by arrow 152. Such linear translation may be accomplished using a second stepper motor that turns a ball screw that linearly moves the platen or any other technique that performs linear translation.

The rotational motion of the platen 108 is used to orient the wafer 102 such that the fiducial marks are always placed at the same location on each wafer that is fiducialized. To perform wafer orientation, the wafer 102 is rotated and translated until the wafer orientation detector assembly 150 indicates that the wafer 102 is oriented by identifying an orientation identifying attribute of the wafer. Specifically, the wafer orientation detector assembly 150 contains a light emitting diode (LED) 156 and a photodetector 158. The LED produces a light beam 160 under the control of the controller 140. The LED 156 and photodetector 158 are aligned such that the wafer blocks the light from the LED from reaching the photodetector except when the notch 162 (an orientation identifying attribute) of the wafer 102 is aligned with the light beam 160. When the photodetector 158 receives light, it sends a signal to the controller 140 indicating that the wafer 102 is oriented, rotation and translation of the wafer 102 is stopped. Although the depicted orientation detector assembly 150 is a notch detector, a similar detector arrangement could be used to detect orientation of a "flat" of a wafer.

The controller 140 is also coupled to the marking assembly 104. The marking assembly 104 contains a laser 116, a fiber optic cable or light tube 118, and beam shaping optics 120. Under the control of controller 140, the laser 116 produces a high intensity light beam that is coupled to the fiber optic cable 118. The beam, for example, is produced by a nitrogen laser having a wavelength of approximately 300 nm and a peak power of more than 1000 watts. The cable 118 couples the laser beam to beam shaping optics 120 that focus the beam 122 upon the wafer 102. The high intensity beam is incident upon the wafer for approximately 1 nS to vaporize a small amount of material upon the surface of the wafer 102 to produce a fiducial mark having an approximate 1–2 $\mu$m radius.

To produce a second mark, the platen 108 can be rotated a predefined distance, e.g., ninety degrees, and the laser source 116 energized again. Alternatively, a plurality of laser marking devices (as represented by cable 118A and beam shaping optics 120A) can be used to simultaneously produce beams 122 and 122A to mark the wafer 102.

Although the marking head described herein forms a mark by laser vaporization, other apparatus for marking a wafer are within the scope of this invention. Such marking apparatus include a mechanical indentation devices, an ion marking device, ink-spraying, felt tip pen, and the like.

Figure 2:
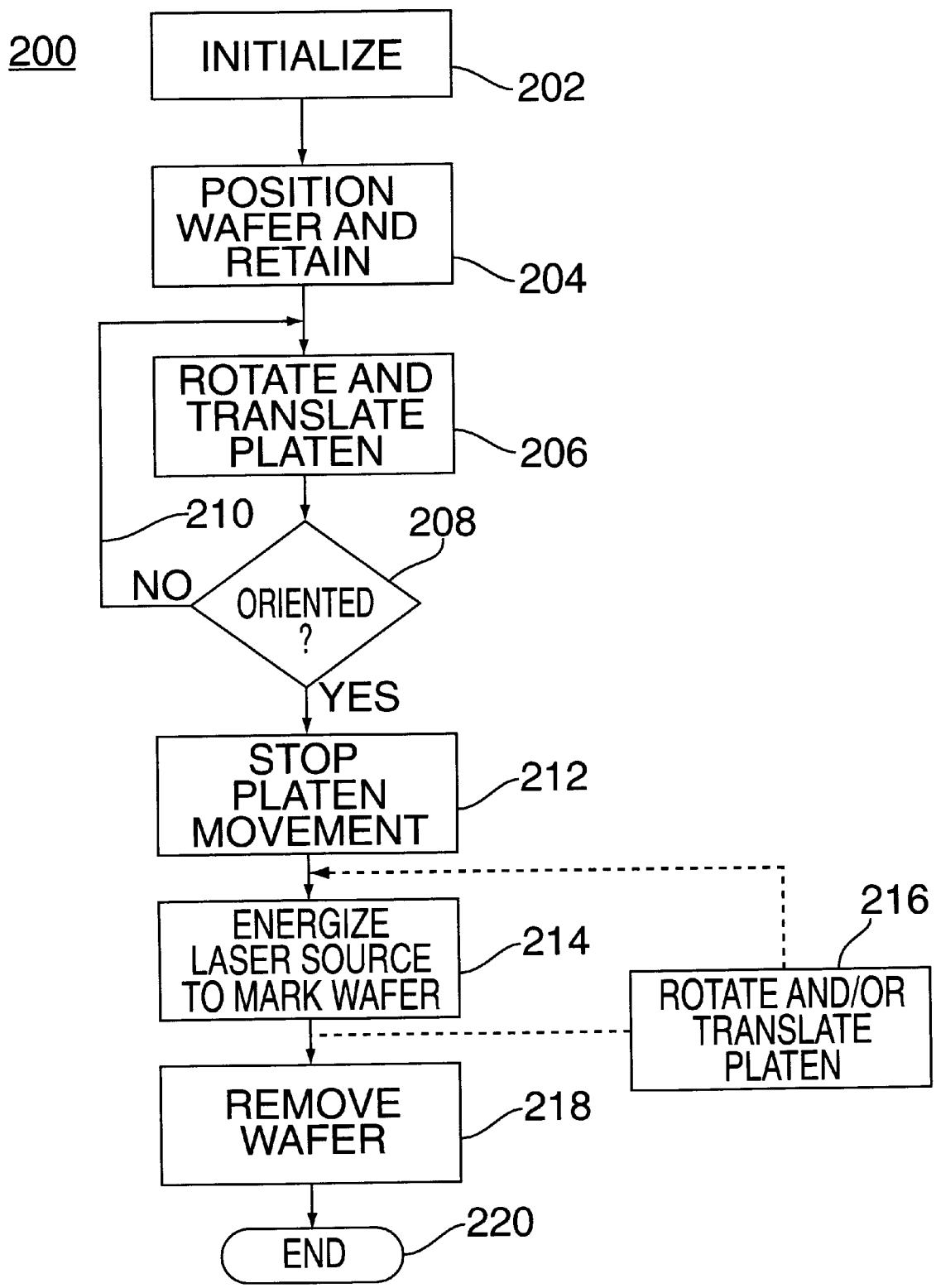
FIG. 2 depicts a flow diagram of a method of operation for the wafer marking apparatus of FIG. 1.

FIG. 2 depicts a flow diagram representation of a software routine 200 that is executed by the controller 140 to perform wafer fiducialization. The routine 200 is intialized at step 202 to initialize variables, clear memory locations and the like. The routine then proceeds to step 204 where a wafer is positioned on the platen and retained. Wafer retention is generally accomplished using a vacuum chuck, but may be accomplished using an electrostatic chuck, edge clamp, and the like. At step 206, the platen is rotated and translated. The rotation and translation algorithm continues via loop 210 until the query at step 208 is affirmatively answered. The query is affirmatively answered upon the orientation detector assembly producing an interrupt signal that indicates that the wafer is oriented properly. Upon the interrupt signal being generated, the rotation and translation of the platen is stopped at step 212. At step 214, the laser source is energized to mark the wafer. If multiple marks are created at once, e.g., by coupling the laser beam to multiple beam shaping optics, the wafer is now fiducialized. The wafer is removed from the platen at step 218 and the routine 200 ends at step 220. However, if the laser marking assembly produces only a single mark and more marks are desired, the routine 200 optionally executes step 216. At step 216, the platen is rotated and/or translated to position a different location on the wafer beneath the wafer marking assembly. The routine 200 then performs step 214 to energize the laser source to mark the wafer. Once the routine 200 has been fully executed, the wafer has been fiducialized with one or more accurately positioned marks. These marks can be easily identified by a analysis tool and used as a wafer coordinate system for performing all subsequent wafer analyses.

Figure 3:
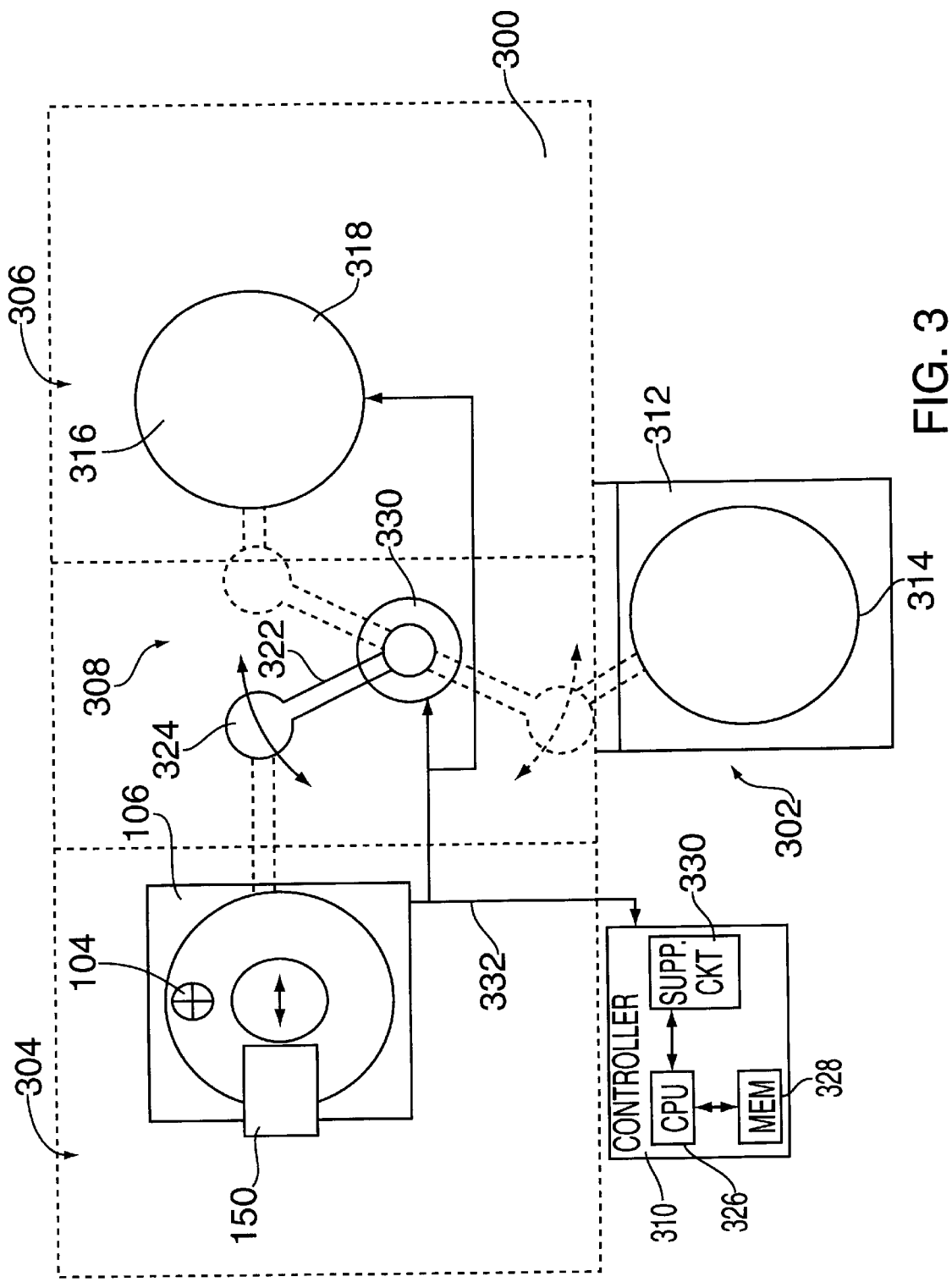
FIG. 3 depicts a top plan view of an integrated analytical tool that utilizes the present invention.

FIG. 3 depicts an integrated analytical tool 300 containing a wafer loading portion 302 (i.e., a load lock), a wafer marking portion 304, a wafer analysis portion 306, a wafer transport mechanism 308, and a tool controller 310. The wafer loading portion 302 is, for example, a conventional load lock containing a wafer cassette 312 that holds a plurality of vertically stacked wafers 314. The laser marking portion 304 contains the elements of FIG. 1 namely a marking assembly 104, a wafer orientation detector assembly 150, a wafer platen assembly 106. The analysis portion 306 contains conventional analysis tool that can utilize the fiducial marks 316 that were placed on the wafer 318 by the laser marking portion 304. Such analysis tools include SEM, TEM, AFM, Auger, laser scanning tools, and the like.

The wafer transport mechanism 308 is a conventional wafer transport robot having a rotatable hub 320 that carries an extensible arm 322. The arm 322 has affixed to its distal end a wafer transport blade 324. In use, the robot 308 rotates the arm about the rotatable hub 320 and selectively extends or retracts the transport blade 324 to place or retrieve a wafer from any of the portions of the tool. The blade 324 can be extended to access a wafer in the marking portion 304, the analysis portion 306 or the wafer cassette 312. As such, wafers can be moved about the tool 300 without operator intervention. Such wafer transport mechanisms are well-known in the art of semiconductor system. For example, commonly assigned U.S. Pat. Nos. 4,951,600 and 5,292,393 issued to Maydan et al. discloses one such robot for moving wafers between a plurality of chambers in a multiple chamber wafer processing system.

Wafer movement through the tool 300 as well as wafer marking and analysis performed by the tool 300 is accomplished by controller 310. The controller 310 is a general purpose computer (e.g., comprising a central processing unit (CPU) 326, memory 328 (e.g., RAM, ROM, disk, or any other memory device) and various support circuits 330 such as power supplies, cache, I/O circuits and the like) that is programmed to cause the system 300 to perform the routines and methods of the present invention. These routines and methods are implemented as software routines that are stored in memory 328. Alternatively, the controller can be a dedicated microprocessor or application specific integrated circuit (ASIC) that is specially designed or programmed to control the system. The controller 310 is coupled to the various operable portions of the tool 300 by a computer bus 332 such as an RS-232 bus using the RS-232 communications protocol.

Figure 4:
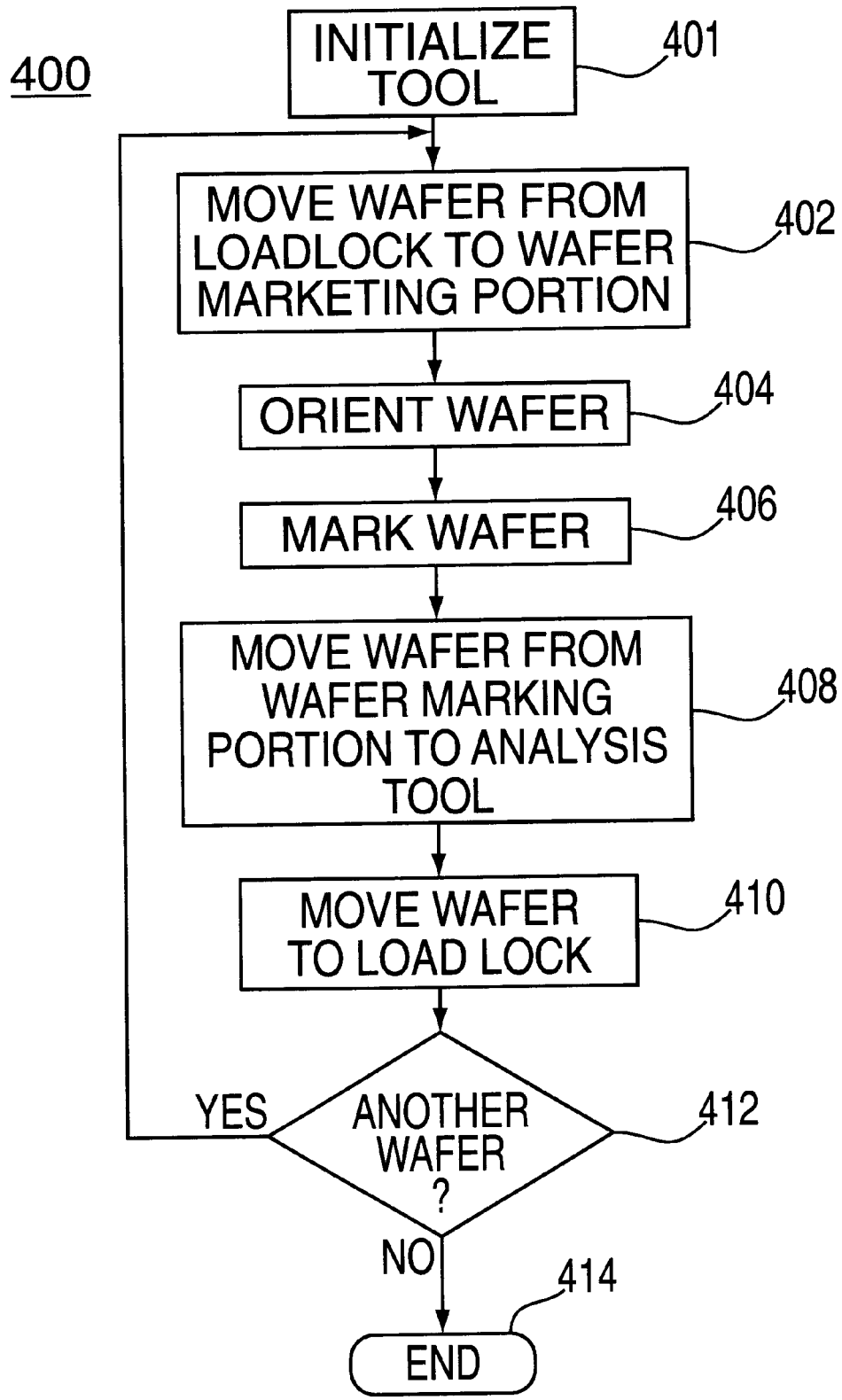
FIG. 4 depicts a flow diagram of a method of operation for the analytical tool of FIG. 3.

FIG. 4 depicts a flow diagram which outlines the operational steps performed by the controller 310 to operate the tool 400 of one embodiment of the present invention. To best understand the following routine 400, the reader should refer to FIGS. 3 and 4.

At step 401, the tool is initialized. At step 402, a wafer is moved by the wafer transport mechanism 408 from the wafer cassette 412 in the load lock to the wafer marking portion 404. At step 404, the wafer marking portion orients the wafer by rotating and translating the wafer to align its flat/notch with the orientation detector 150. Once aligned, the wafer is marked with fiducial marks 416 by the laser marking assembly 104 as described with respect to FIGS. 1 and 2 above. After fiducial marking is complete, the fiducialized wafer is moved from the wafer marking portion 404 to the analysis portion 406. The analysis portion performs conventional wafer analysis such as SEM, AFM, laser scanning and the like in a conventional manner under control of controller 410. After analysis is complete, the wafer is moved, in step 410, from the analysis portion to the load lock. The routine queries, at step 412, whether another wafer is to be fiducialized. If the query is affirmatively answered, the routine proceeds to step 402 to move another wafer into the wafer marking portion. If another wafer is not to be fiducialized, the routine proceeds from step 412 to step 414, where the routine ends.

Although a single analysis portion has been described, the inventive analytical tool could easily be expanded to include a plurality analysis portions. As such, an analytical suite capable of performing a multitude of analyses upon a wafer using the fiducial marks produced by the wafer marking portion.

Figure 5:
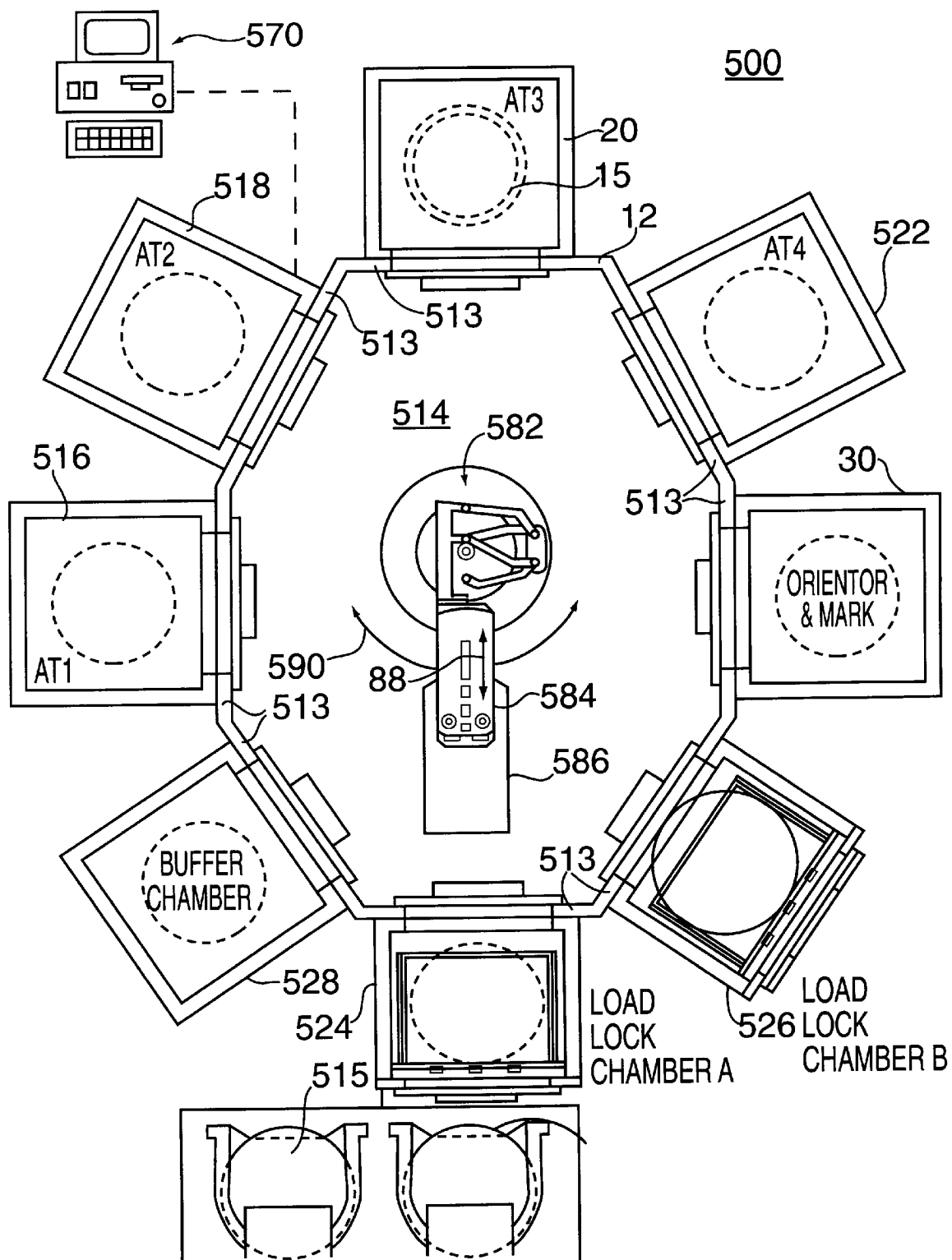
FIG. 5 shows a schematic top plan view of an analytical suite of one embodiment of the present invention.

FIG. 5 depicts a schematic top plan view of such an analytical suite 500. The suite 500 is particularly adapted to analyze a plurality of substrates, such as silicon wafers. The suite 500 comprises an enclosed, generally octagonal main frame or housing 512 having eight sidewalls 513 that define an enclosed transfer enclosure or chamber 514. The enclosure may or may not be at vacuum.

The suite 510 contains, for example, four analytical tools (AT1–AT4) 516, 518, 520, 522, a transfer chamber 514, a buffer chamber 528, a wafer-orientor and marking tool 530, and a pair of load lock chambers 524 and 526. Each analytical tool represents a different stage of analysis. The tools may include an Orbot WF-7xx tool, a Tencor SurfScan device, an SEM, a AFM, a TEM, an EDX and the like. The platform could be adapted to attach any form of tool for analyzing a wafer or portion of a wafer.

To effectuate wafer transfer amongst these tools, the transfer chamber 514 contains a first robotic transfer mechanism 582, e.g., a single blade robot (SBR). The wafers 515 are typically carried from storage to the system in a plastic transport cassette 525 that is placed within one of the load lock chambers 524 or 526. The robotic transport mechanism 582 transports the wafers 515, one at a time, from the cassette 525 to the wafer orientor and marking tool 530. The buffer chamber 528 is generally used unless special processing is required before, after or between analysis stages. Such special processing may be a wafer process such as etching, ashing, deposition and the like. The various tools could then be used to quantify the effect of the process on wafer defects or wafer characteristics. Individual wafers are carried upon a wafer transport blade 586 that is located at the distal end 584 of the robotic mechanism 582. The mechanism, although shown in a contracted states, extends and contracts as represented by arrow 588 and rotates as represented by arrow 590. The transport operation is controlled by the controller 570.

The controller 570 controls the processing and wafer transfer performed by the suite 500. The controller contains a microprocessor (CPU), a memory for storing the control routines, and support circuits such as power supplies, clock circuits, cache and the like. The controller 570 also contains input/output peripherals such as a keyboard, mouse, and display. The controller 570 is a general purpose computer that is programmed to perform the sequencing and scheduling operations that facilitate wafer analysis and transport. The software routines that control the suite 500 are stored in memory and executed by the microprocessor to facilitate control of the suite 500.

The controller 570 instructs the transport mechanism and positions the wafers in the tools 516, 518, 520, and 522 in accordance with a analysis schedule. To facilitate such wafer movement, the transfer chamber 514 is surrounded by, has access to, the four tools 516, 518, 520 and 522. Once analysis is complete within a tool, the transport mechanism 582 moves the analyzed wafer from the tool and transports the wafer to the load lock chamber 524 or 526.

Although various embodiments which incorporate the teachings of the present invention have been shown and described in detail herein, those skilled in the art can readily devise many other varied embodiments that still incorporate these teachings.

What is claimed is:

1. Apparatus for marking a wafer comprising:

a wafer platen for retaining a wafer;

a wafer marking assembly, positioned above the wafer platen, for selectively marking said wafer with a fiducial mark, where the fiducial mark defines a wafer coordinate system;

a wafer orientation detector, positioned proximate said wafer platen, to determine the orientation of the wafer; and a platen drive assembly, coupled to said wafer platen and said wafer marking assembly, for positioning the wafer platen beneath the wafer marking assembly in response to a signal from said wafer orientation detector.

2. The apparatus of claim 1 further comprising:

a controller, coupled to said drive assembly and said wafer marking assembly, for controlling the position of said platen relative to the wafer marking assembly and for selectively positioning the wafer marking assembly to mark the wafer.

3. The apparatus of claim 1 wherein said wafer marking assembly further comprises at least one laser marking device.

4. The apparatus of claim 3 wherein said at least one wafer marking device comprises:

a laser source for producing a high intensity laser beam;

beam shaping optics; and a fiber optic cable, coupled between said laser source and said beam shaping optics, for propagating said laser beam from said laser source to said beam shaping optics.

5. The apparatus of claim 1 wherein said wafer orientation detector identifies a notch or flat of a wafer.

6. The apparatus of claim 5 wherein said wafer orientation detector comprises:

a light emitting diode; and a photodetector, where said light emitting diode and said photodetector are spaced apart on either side of a wafer when said wafer is retained by said wafer platen, said photodetector produces a signal indicating that said notch or flat is aligned with said light emitting diode.

7. A method of marking a wafer comprising the steps of:

orienting a wafer to identify a marking location on the surface of the wafer; and marking the wafer with a fiducial mark that defines a wafer coordinate system.

8. The method of claim 7 wherein said orienting step further comprises:

rotating and translating the wafer;

identifying an orientation identifying attribute of the wafer; and stopping rotating and translating the wafer upon identifying the orientation identifying attribute.

9. The method of claim 8 wherein said orientation identifying attribute of the wafer is either a flat or a notch.

10. The method of claim 7 wherein the marking step further comprises:

energizing a laser source;

coupling a laser beam from the laser source to beam shaping optics; and focusing said laser beam upon said wafer to form said fiducial mark.

* * * * *